US012648373B2

(12) United States Patent
Liang

(10) Patent No.: US 12,648,373 B2
(45) Date of Patent: Jun. 2, 2026

(54) EPITAXIAL STRONTIUM TITANATE ON SILICON

(71) Applicant: Psiquantum, Corp., Palo Alto, CA (US)

(72) Inventor: Yong Liang, Niskayuna, NY (US)

(73) Assignee: Psiquantum, Corp., Palo Alto, CA (US)

( * ) Notice: Subject to any disclaimer, the term of this patent is extended or adjusted under 35 U.S.C. 154(b) by 213 days.

(21) Appl. No.: 18/112,395

(22) Filed: Feb. 21, 2023

(65) Prior Publication Data

US 2023/0197443 A1     Jun. 22, 2023

Related U.S. Application Data

(63) Continuation of application No. 16/791,914, filed on Feb. 14, 2020, now Pat. No. 11,615,954.

(60) Provisional application No. 62/878,653, filed on Jul. 25, 2019, provisional application No. 62/878,678, filed on Jul. 25, 2019.

(51) Int. Cl.
| | |
|---|---|
| *H10P 14/20* | (2026.01) |
| *H10D 64/01* | (2025.01) |
| *H10P 14/24* | (2026.01) |
| *H10P 14/60* | (2026.01) |
| *H10P 14/692* | (2026.01) |

(52) U.S. Cl.
CPC ... *H10P 14/2905* (2026.01); *H10D 64/01342* (2026.01); *H10P 14/24* (2026.01); *H10P 14/6308* (2026.01); *H10P 14/6936* (2026.01)

(58) Field of Classification Search
CPC ......... H01L 21/02488; H01L 21/02505; H01L 21/02521; H01L 21/02381; H01L 21/02513
See application file for complete search history.

(56) References Cited

U.S. PATENT DOCUMENTS

| | | | |
|---|---|---|---|
| 5,448,087 | A | 9/1995 | Streit et al. |
| 11,615,954 | B2 | 3/2023 | Liang |
| 2010/0052024 | A1 | 3/2010 | Kiyomura et al. |
| 2019/0019801 | A1 | 1/2019 | Yoo |

OTHER PUBLICATIONS

U.S. Appl. No. 16/791,914, "Advisory Action", Apr. 21, 2022, 4 pages.

(Continued)

*Primary Examiner* — Tony Tran
(74) *Attorney, Agent, or Firm* — Kilpatrick Townsend & Stockton LLP

(57) ABSTRACT

A method for processing a substrate includes positioning a silicon substrate in a deposition chamber. One or more intermediate layers are deposited on a surface of the silicon. The one or more intermediate layers can include strontium, which combines with the silicon to form strontium silicide. Alternatively, the one or more intermediate layers comprise germanium. A layer of amorphous strontium titanate is deposited on the one or more intermediate layers in a transient environment in which oxygen pressure is reduced while temperature is increased. The substrate is then exposed to an oxidizing and annealing atmosphere that oxidizes the one or more intermediate layers and converts the layer of amorphous strontium titanate to crystalline strontium titanate.

20 Claims, 7 Drawing Sheets

(56)    References Cited

OTHER PUBLICATIONS

U.S. Appl. No. 16/791,914, "Final Office Action", Feb. 14, 2022, 11 pages.
U.S. Appl. No. 16/791,914, "Non-Final Office Action", Aug. 27, 2021, 10 pages.
U.S. Appl. No. 16/791,914, "Non-Final Office Action", Jun. 3, 2022, 10 pages.
U.S. Appl. No. 16/791,914, "Notice of Allowance", Nov. 21, 2022, 14 pages.

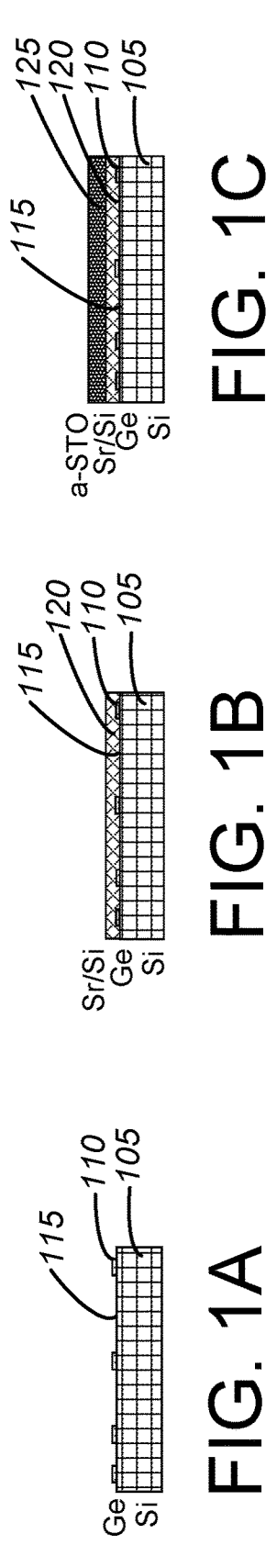
FIG. 1A
FIG. 1B
FIG. 1C
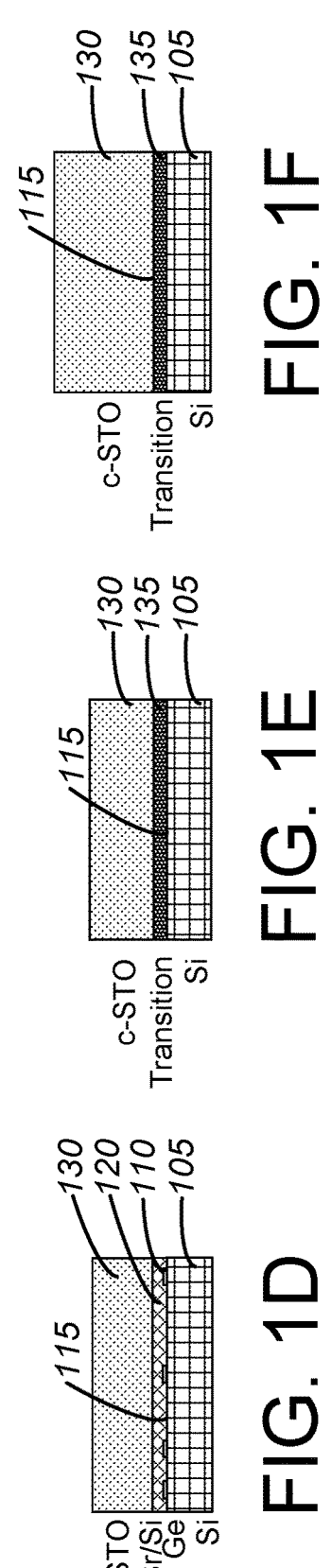
FIG. 1D
FIG. 1E
FIG. 1F

*200*

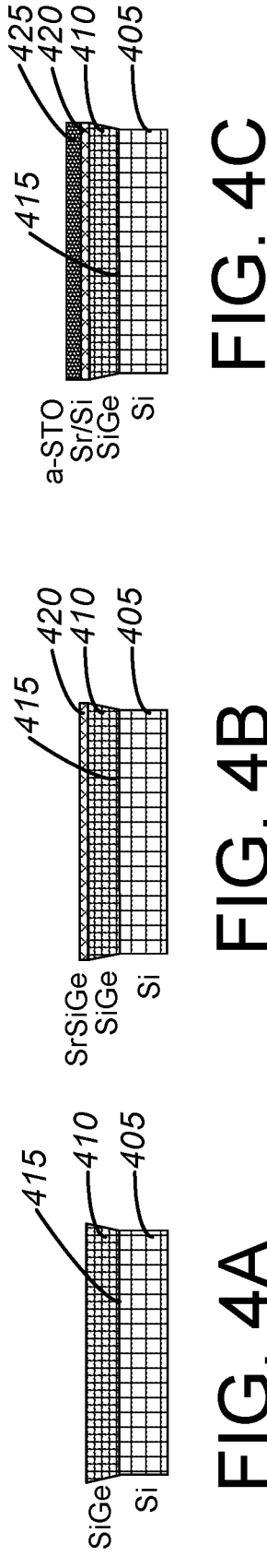
FIG. 4A
FIG. 4B
FIG. 4C
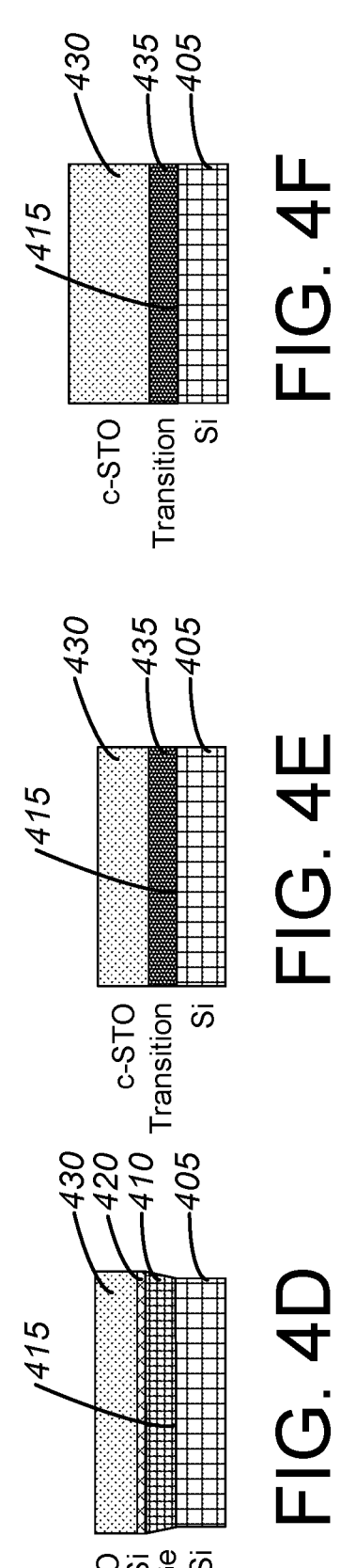
FIG. 4D
FIG. 4E
FIG. 4F

700

PROVIDE SILICON WAFER
WITH CLEAN SURFACE — 705

DEPOSIT LAYER OF Sr — 710

DEPOSIT Sr AND Ti TO
FORM a-STO — 715

CRYSTALIZE a-STO TO c-
STO, CONSUMING Sr
LAYER — 720

ANNEAL IN OXYGEN — 725

DEPOSIT Sr AND Ti TO
INCREASE c-STO — 730

EPITAXIAL STRONTIUM TITANATE ON SILICON

CROSS-REFERENCES TO OTHER APPLICATIONS

This application is a continuation of U.S. patent application Ser. No. 16/791,914, filed on Feb. 14, 2020, which claims priority to U.S. Provisional Patent Application No. 62/878,678, filed on Jul. 25, 2019, and to U.S. Provisional Patent Application No. 62/878,653, filed on Jul. 25, 2019, which are hereby incorporated by reference in their entirety for all purposes. This application is related to commonly assigned U.S. patent application Ser. No. 16/791,948, filed on Feb. 14, 2020, now U.S. Pat. No. 11,302,528, the disclosure of which is hereby incorporated by reference in its entirety for all purposes.

FIELD

The described embodiments relate generally to silicon-based wafers for photonic circuits. More particularly, the present embodiments relate to silicon wafers that include an epitaxial layer of $SrTiO_3$.

BACKGROUND

Currently there are several methods available for forming an epitaxial layer of $SrTiO_3$ on a silicon wafer. Some methods use a "pulsed" process in which the wafer is subjected to a high oxygen atmosphere for a brief period while the $SrTiO_3$ layer is deposited. Each pulse is followed by an exposure to high temperature to crystallize the $SrTiO_3$ layer and a lengthy cooling cycle before the subsequent deposition pulse. Care must be taken to minimize the exposure of the wafer simultaneously to a high oxygen pressure and to high temperatures so the surface of the silicon does not form $SiO_2$. Thus, in this process the only time when the $SrTiO_3$ layer can be grown is during the brief deposition pulse, whereas during the lengthy cooling cycle no growth takes place, limiting the throughput of the process.

In other embodiments, the oxygen pressure within the chamber is maintained relatively low while the temperature is held relatively high to increase the growth rate of crystalline $SrTiO_3$. However, because of the high temperature the process can difficult to control so $SiO_2$ is not formed on the silicon surface and further, the growth rate of $SrTiO_3$ remains a process bottleneck. In addition, both of the processes described above form the $SrTiO_3$ layer directly on the silicon, which has a relatively poor lattice match to $SrTiO_3$, resulting in reduced quality of the $SrTiO_3$ layer and a strained interface.

New methods for forming an epitaxial $SrTiO_3$ layer on a silicon wafer are needed that result in increased growth rate, wider process controls and an improved lattice match to the silicon.

SUMMARY

In some embodiments method for processing a substrate comprises positioning the substrate in a deposition chamber, wherein the substrate comprises a wafer of single crystal silicon. One or more intermediate layers are formed on the wafer of silicon and an amorphous strontium titanium oxide layer is formed on the one or more intermediate layers. The amorphous strontium titanium oxide layer is converted to a crystalline strontium titanium oxide layer and the one or more intermediate layers are oxidized. A thickness of the crystalline strontium titanium oxide layer is increased.

In some embodiments the crystalline strontium titanium oxide layer comprises crystalline strontium titanate. In various embodiments the amorphous strontium titanium oxide layer is formed in an environment in which oxygen pressure is reduced while temperature is simultaneously increased. In some embodiments the one or more intermediate layers comprise germanium. In various embodiments the one or more intermediate layers comprise a combination of strontium and silicon.

In some embodiments the one or more intermediate layers comprise a combination of strontium, germanium and silicon. In various embodiments the one or more intermediate layers comprise a graded layer that transitions from a composition greater in silicon than germanium at the wafer of silicon to a composition greater in germanium than silicon at a top surface of the one or more intermediate layers. In some embodiments oxidizing the one or more intermediate layers creates a transition layer comprising Si1-xGexO2 and SrSiO.

In some embodiments a method for forming a crystalline strontium titanium oxide layer on a silicon-based substrate comprises depositing a strontium containing layer on the silicon-based substrate and depositing an amorphous strontium titanium oxide layer on the strontium containing layer. The amorphous strontium titanium oxide layer is converted to the crystalline strontium titanium oxide layer. The strontium containing layer is oxidized and a thickness of the crystalline strontium titanium oxide layer is increased. In various embodimetns the amorphous strontium titanium oxide layer is deposited in an environment in which oxygen pressure is reduced while temperature is simultaneously increased.

In some embodiments a silicon germanium layer is deposited on the silicon-based substrate before the depositing the strontium containing layer. In various embodiments the silicon germanium layer is a graded layer that transitions from a composition greater in silicon than germanium at the silicon substrate to a composition greater in germanium than silicon at a top surface of the graded layer. In some embodiments the crystalline strontium titanium oxide layer comprises crystalline strontium titanate. In various embodiments a layer of strontium silicide is formed when depositing the strontium containing layer on the silicon-based substrate. In some embodiments oxidizing the strontium containing layer creates a transition layer comprising Si1-xGexO2 and SrSiO.

In some embodiments a method for processing a substrate comprises positioning the substrate in a deposition chamber, wherein the substrate comprises a top layer of silicon. One or more transition layers are formed on the top layer of silicon. An amorphous layer of strontium titanium dioxide is formed on the one or more transition layers. The substrate is heated to a temperature above 500° C. causing the amorphous layer of strontium titanium dioxide to convert to a crystalline layer of strontium titanium dioxide. In various embodiments the amorphous layer of strontium titanium dioxide is formed in an environment in which oxygen pressure is reduced while temperature is simultaneously increased.

In some embodiments the one or more transition layers comprise strontium. In various embodiments the one or more intermediate layers comprise germanium. In some embodiments the one or more intermediate layers comprise a combination of strontium and silicon.

To better understand the nature and advantages of the present disclosure, reference should be made to the following description and the accompanying figures. It is to be understood, however, that each of the figures is provided for the purpose of illustration only and is not intended as a definition of the limits of the scope of the present disclosure. Also, as a general rule, and unless it is evident to the contrary from the description, where elements in different figures use identical reference numbers, the elements are generally either identical or at least similar in function or purpose.

BRIEF DESCRIPTION OF THE DRAWINGS

FIGS. 1A-1F illustrate simplified cross-sectional views of steps for forming a crystalline $SrTiO_3$ layer on a silicon wafer, according to embodiments of the disclosure;

FIGS. 4A-4F illustrate simplified cross-sectional views of steps for forming a $SrTiO_3$ layer on a silicon wafer that includes a graded silicon germanium layer, according to embodiments of the disclosure;

DETAILED DESCRIPTION

Figure 2:
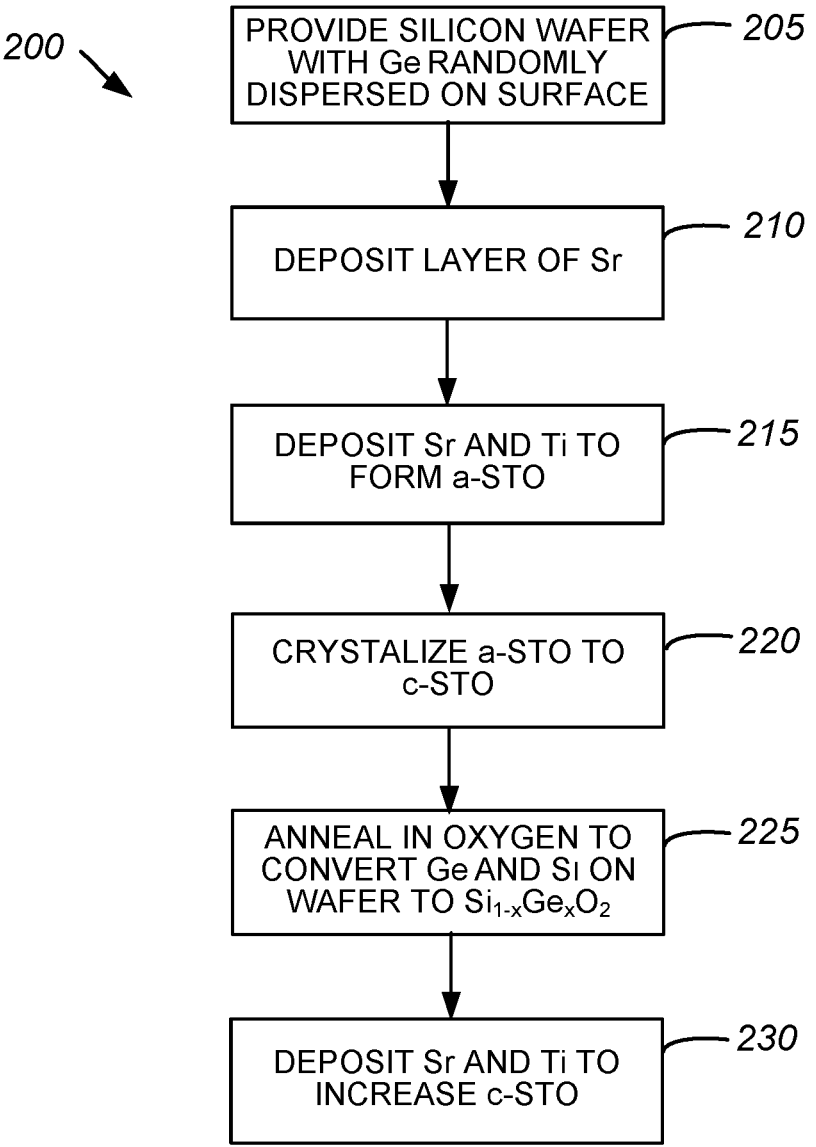
FIG. 2 is a method for forming the crystalline $SrTiO_3$ layer on a silicon wafer according to the steps illustrated in FIGS. 1A-1F.

Some embodiments of the present disclosure relate to methods for forming an epitaxial layer of $SrTiO_3$ on a silicon wafer. Some embodiments relate to the formation of an intermediate amorphous $Si_{1-x}Ge_xO_2$ or $SiO_2$ layer between the silicon and the $SrTiO_3$. While the present disclosure can be useful for a wide variety of configurations, some embodiments of the disclosure are particularly useful for forming silicon wafers for use in photonic circuits, as described in more detail below.

For example, in some embodiments a silicon wafer includes atomic deposits of Ge randomly distributed across a top surface. A layer of $SrTiO_3$ can then be formed on the silicon surface using a process that starts at a high oxygen pressure and a low temperature while a thin amorphous $SrTiO_3$ film is formed. The pressure can be reduced while simultaneously increasing the temperature, all the while depositing $SrTiO_3$. As the temperature increases the $SrTiO_3$ crystallizes as the oxygen pressure is reduced and the temperature continually increases to a steady state. After growing an initial $SrTiO_3$ layer, the wafer can be exposed to an oxidizing annealing treatment to convert the Ge that was distributed across the top surface of the silicon (now disposed between the Si and the $SrTiO_3$ layer), to amorphous $Si_{1-x}Ge_xO_2$ which is transparent to certain wavelengths of laser light. The wafer can then be exposed to an environment of moderate oxygen pressure and high temperature to grow the $SrTiO_3$ layer to the desired final thickness.

In another example, a silicon wafer includes a graded layer of $Si_{1-x}Ge_x$ where the graded layer changes concentration from a low concentration of Ge at the Si wafer interface to a higher concentration of Ge at the top of the graded layer. The graded layer can be used to accommodate the lattice mismatch between silicon and the subsequent $SrTiO_3$ layer. A layer of Sr can be deposited on the graded layer, followed by a layer of $SrTiO_3$ using the method described above. During an oxidizing annealing treatment, as described above, the graded layer of $Si_{1-x}Ge_x$, is converted to $Si_{1-x}Ge_xO_2$ which is transparent to certain wavelengths of laser light.

In another example, a layer of Sr is deposited on a silicon wafer. A subsequent layer of $SrTiO_3$ can be deposited on the layer of Sr, using the method described above. During a subsequent oxidizing annealing treatment the surface of the silicon is converted to $SiO_2$, which is transparent to certain wavelengths of laser light.

In order to better appreciate the features and aspects of forming epitaxial $SrTiO_3$ layers on silicon wafers according to the present disclosure, further context for the disclosure is provided in the following section by discussing several methods of forming epitaxial $SrTiO_3$ layers on silicon wafers, according to embodiments of the present disclosure. These embodiments are for example only and other methods can be employed to form epitaxial $SrTiO_3$ layers on a photonic wafer.

FIGS. 1A-1F illustrate simplified cross-sectional views of steps, according to a method 200 described in FIG. 2, for forming a $SrTiO_3$ layer on a silicon wafer, according embodiments of the disclosure.

As illustrated in FIG. 1A (step 205 of FIG. 2) a silicon wafer 105 that includes atomic deposits of Germanium (Ge) 110 randomly dispersed on a top surface 115 is provided. In some embodiments silicon wafer 105 can be between 500 microns and 1000 microns thick and can have a single crystal structure. In other embodiments silicon wafer 105 can be in form of silicon on insulator (SOI) where a top layer of thin silicon is separated from the supporting bulk silicon by a layer of insulating $SiO_2$.

As illustrated in FIG. 1B (step 210 of FIG. 2) strontium (Sr) is deposited on top surface 115 of silicon wafer 105 forming an epitaxial layer of strontium silicide (SrSi) 120. In some embodiments layer of SrSi 120 has a (2×1) structure in which a size of an atomic unit cell is twice as large (2×) as that of the underlying Si in one direction, but is the same size (1×) as that of the of underlying Si in the direction normal to direction that is twice as large as that of the Si. In some embodiments layer of SrSi 120 can be between one half an atomic layer to one atomic layer thick and can be deposited via molecular-beam epitaxy (MBE) or other deposition process.

As illustrated in FIG. 1C (step 215 of FIG. 2) a layer of amorphous strontium titanate ($SrTiO_3$) 125 can be deposited on layer of SrSi 120. Layer of SrSi 120 can be used as a transition layer wherein the Sr is atomically bonded to layer of $SrTiO_3$ 125 and the Si is atomically bonded to silicon wafer 105. In some embodiments the growth of amorphous $SrTiO_3$ layer 125 can be performed in a transient environment, as described in more detail in FIGS. 3A-3C. In some embodiments any composition of strontium titanium oxide can be used for layer 120.

Figures 3A, 3B, 3C:
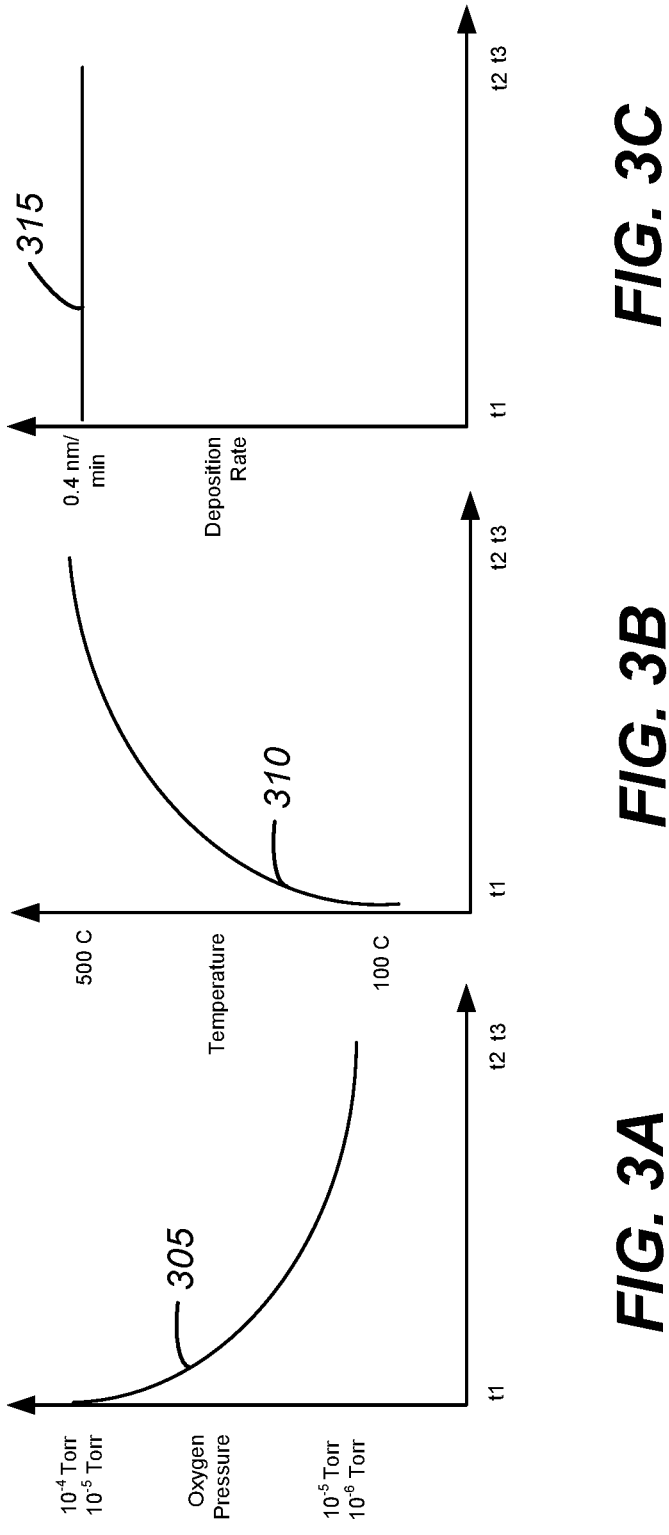
FIGS. 3A-3C illustrates example processing parameters for growing an amorphous $SrTiO_3$ layer on the silicon wafer described in FIGS. 1A-1F and 2.

Now referring to FIGS. 3A-3C, example process parameters of one method for growing $SrTiO_3$ layer 125 are described. As shown in FIG. 3A, at time t1, which is an initiation of the growth of amorphous $SrTiO_3$ layer 125 (see FIG. 1C), oxygen pressure 305 is held within a range of $10^{-4}$ to $10^{-5}$ torr. As shown in FIG. 3B, at the same time t1, a temperature 310 of the substrate is controlled below 200° C. Further, as shown in FIG. 1C, at time t1 elemental Sr and Ti are introduced to deposit amorphous $SrTiO_3$ layer 125 at a substantially constant deposition rate 315. As amorphous $SrTiO_3$ layer 125 forms it can create a protective barrier to prevent the formation of $SiO_2$ that can be formed from oxygen penetrating layer of SrSi 120 and oxidizing underlying top surface 115 of silicon wafer 105. In some embodiments a $SrTiO_3$ layer 125 thickness of 2-10 monolayers can be adequate to protect the top surface 115 of silicon wafer 105 from forming $SiO_2$, when using process parameters similar to those described in FIGS. 3A-3C. One of skill in the art will appreciate that at lower temperatures a relatively thinner $SrTiO_3$ layer 125 may be used and at higher temperatures a relatively thicker $SrTiO_3$ layer may be used.

As further illustrated in FIGS. 3A-3C, as time progresses to t2, the oxygen pressure can be reduced to $10^{-5}$ to $10^{-6}$ torr and the temperature can be increased to approximately 550° C. During this transition, Sr and Ti are continually introduced to the silicon wafer such that the growth rate of $SrTiO_3$ layer 125 remains roughly constant, as shown in FIG. 3C. In some embodiments the growth rate of the $SrTiO_3$ layer 125 is approximately 0.4 nanometers/minute. As would be appreciated by one of skill in the art, this disclosure is not limited to the example process parameters described herein. In other embodiments other oxygen pressures, substrate temperatures and deposition rates can be used without departing from this disclosure. In one example the oxygen pressure can be reduced to between $10^{-4}$ to $10^{-7}$ torr and the temperature can be increased to a range between 500° C. to 600° C.

As illustrated in FIG. 1D (step 220 of FIG. 2), as the temperature of silicon wafer 105 increases (see t2 in FIG. 3B), amorphous $SrTiO_3$ layer 125 (see FIG. 1C) crystalizes, forming an epitaxial crystalline $SrTiO_3$ layer 130. As shown in FIG. 3C, the growth rate of $SrTiO_3$ layer 130 remains substantially constant from t1 to t2. Because $SrTiO_3$ layer 130 is now crystalline, the new $SrTiO_3$ layer grown on crystallized $SrTiO_3$ is also crystalline.

In one embodiment, as $SrTiO_3$ layer 130 approaches a thickness of approximately 3 nanometers, the oxygen pressure and the temperature can be stabilized (see t3 in FIGS. 3A, 3B) and crystalline $SrTiO_3$ layer 130 continues to grow at a substantially constant growth rate. In some embodiments, at a thickness of approximately 3 nanometers, $SrTiO_3$ layer 130 is of sufficient thickness to stabelize the $SrTiO_3$ layer and to prevent oxidation of the underlying Si due to diffusion of oxygen through the $SrTiO_3$ layer 130, thus the oxygen partial pressure can be increased, if desired, during the remainder of the $SrTiO_3$ layer growth. Additionally, in some embodiments the growth rate of $SrTiO_3$ layer 130 can be increased by increasing the Sr and Ti fluxes during $SrTiO_3$ layer growth.

As would be appreciated by one of skill in the art with the benefit of this disclosure the thickness of $SrTiO_3$ layer 130 that is adequate to prevent oxidation of silicon wafer 105 can vary depending upon a temperature of silicon wafer 105, the partial pressure of the oxygen in the growth environment and other factors. Thus, in some embodiments a $SrTiO_3$ layer 130 thickness that is adequate to prevent oxidation of silicon wafer 105 can be between 1 and 6 nanometers and in various embodiments between 2 and 4 nanometers and in one embodiment between 2.5 and 3.5 nanometers.

As illustrated in FIG. 1E (step 225 of FIG. 2) silicon wafer 105 is exposed to molecular oxygen, atomic oxygen, or ozone at a temperature above 600° C. The oxygen permeates crystalline $SrTiO_3$ layer 130 and oxidizes atomic deposits of Ge 110 (see FIG. 1D) and layer of SrSi 120 forming transition layer 135. More specifically, the molecular oxygen converts atomic deposits of Ge 110 to amorphous $Si_{1-x}Ge_xO_2$ (SiGeO) regions that can be non-uniformly distributed both horizontally across top surface 115 of silicon wafer 105 and vertically, based on the location and concentration of the atomic deposits of Ge 110. The composition of the amorphous $Si_{1-x}Ge_xO_2$ regions can also vary due to inter-diffusion of the $Si_{1-x}Ge_xO_2$ with silicon wafer 105. The resulting amorphous $Si_{1-x}Ge_xO_2$ regions are transparent at certain wavelengths that may be suitable for use in lasers, including 1550 nanometers. The molecular oxygen also converts layer of SrSi 120 to SrSiO and/or Sr(Si,Ge)O. Thus, transition layer 135 can be composed of varying concentrations of amorphous $Si_{1-x}Ge_xO_2$, $SrSiO_x$ and/or Sr(Si,Ge)O. Further, during this step, the exposure to annealing temperatures can improve the crystallinity of the crystalline $SrTiO_3$ layer 130. In some embodiments any composition of silicon germanium oxide can be used in transition layer 135.

As illustrated in FIG. 1F (step 230 of FIG. 2) after the oxidation/annealing step (step 225 of FIG. 2), the crystalline $SrTiO_3$ layer 130 growth process is restarted and the crystalline $SrTiO_3$ layer can be grown to the desired thickness. In some embodiments the oxidation/annealing step 225 can be repeated as needed to improve the crystallinity of the crystalline $SrTiO_3$ layer. In some embodiments step 225 can be repeated, but without exposing the substrate to molecular oxygen.

In some embodiments a ferroelectric oxide such as, but not limited to, $BaTiO_3$, (Ba,Sr)$TiO_3$ (BST), (Pb(Zr,Ti)$O_3$ (PZT), (Pb, La)(Zr,Ti)$O_3$ (PLZT), (Sr,Ba)$Nb_2O_6$ (SBN) or $LiNbO_3$ can be grown on crystalline $SrTiO_3$ layer 130 using myriad deposition techniques, including but not limited to, MBE, chemical vapor deposition (CVD), sputtering deposition, pulsed laser deposition (PLD) or sol gel process. The resulting stack, ferroelectric oxide/$SrTiO_3$/$Si_{1-x}Ge_xO_2$/Si can be transparent to certain wavelengths of light, including 1550 nanometers, making the structure useful, for example, for optical switches and waveguides. In yet further embodiments, the aforementioned post oxidation process can be employed after a ferroelectric layer is grown on the $SrTiO_3$/$Si_{1-x}Ge_xO_2$/Si stack.

It will be appreciated that process 200 is illustrative and that variations and modifications are possible. Steps described as sequential may be executed in parallel, order of steps may be varied, and steps may be modified, combined, added or omitted.

Figure 5:
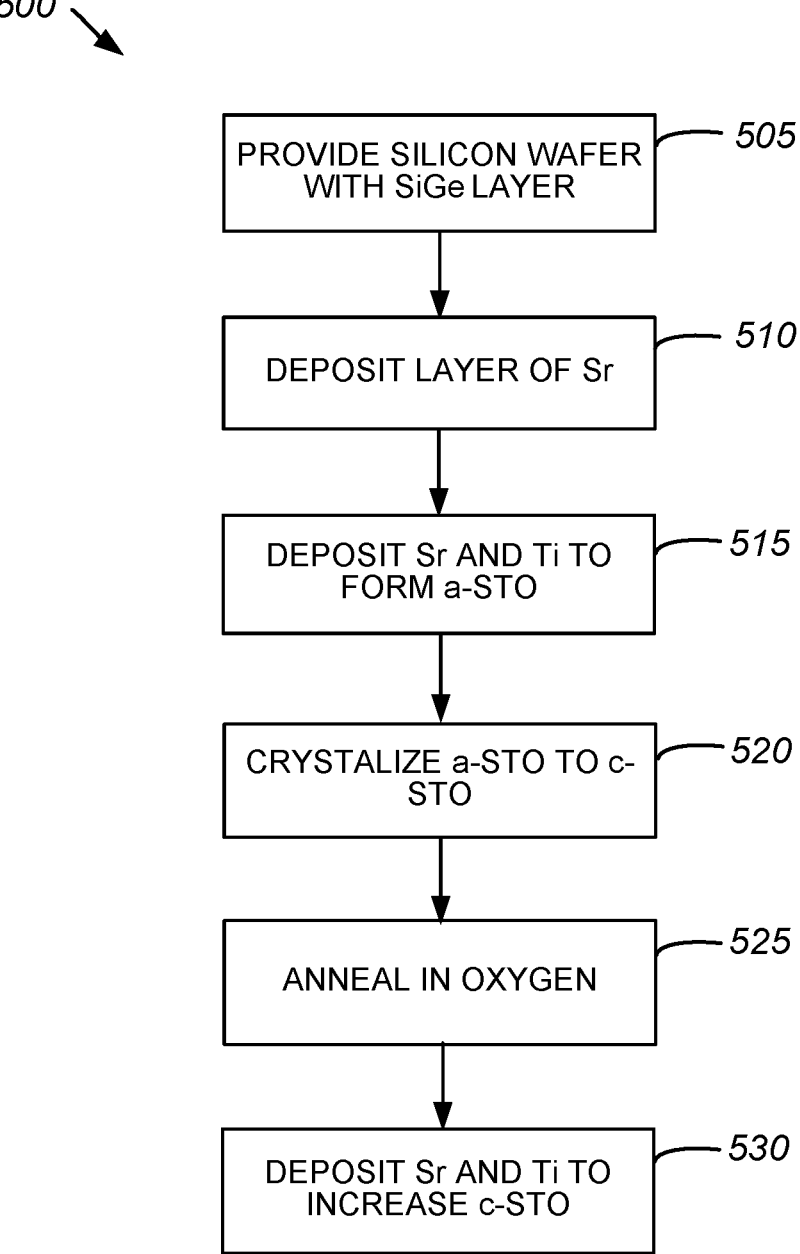
FIG. 5 is a method for forming the crystalline $SrTiO_3$ layer on a silicon wafer according to the steps illustrated in FIGS. 4A-4F.

FIGS. 4A-4F illustrate simplified cross-sectional views of steps, according to a method 500 described in FIG. 5, for forming a $SrTiO_3$ layer on a silicon wafer, according embodiments of the disclosure. As shown in FIG. 5, method 500 uses a similar process as method 200, however in method 500 first step 505 uses a silicon wafer having a SiGe layer, instead of the silicon wafer having randomly distributed Ge atoms. Further, method 500 includes step 510 to oxidize the SiGe layer.

As illustrated in FIG. 4A (step 505 of FIG. 5) a silicon wafer 505 that includes a pregrown epitaxial graded layer of $Si_{1-x}Ge_x$ 410 is provided. In some embodiments a graded layer of $Si_{1-x}Ge_x$ 410 can be deposited. In other embodiments graded layer of $Si_{1-x}Ge_x$ 410 may be pre-deposited on silicon wafer 505 and include a native oxide of $Si_{1-x}Ge_xO_2$ that may be removed before further processing of the wafer is performed. In various embodiments graded layer of $Si_{1-x}Ge_x$ 410 can change composition through its thickness such that at silicon surface 415 the graded layer of $Si_{1-x}Ge_x$ has a higher percentage of silicon and has therefore closely matches the lattice of silicon wafer 405 and transitions to a higher percentage of Ge at the top of the layer and therefore closely matches the lattice of the subsequent $SrTiO_3$ layer (see FIGS. 4D-4F, below). In some embodiments silicon wafer 405 can be a single crystal bulk silicon wafer while in other embodiments silicon wafer 405 can be a SOI wafer where a top thin silicon layer is separated from the supporting bulk silicon by a layer of insulating $SiO_2$.

As illustrated in FIG. 4B (step 510 of FIG. 5) a layer of epitaxial Sr is deposited on layer of $Si_{1-x}Ge_x$ 410 to form an epitaxial layer of $SrSi_{1-x}Ge_x$ 420. In some embodiments layer of $SrSi_{1-x}Ge_x$ 420 has a (2×1) structure in which the size of the atomic unit cell is twice (2×) as large as that of the underlying Si in one direction, but is the same size (1×) as that of the of underlying Si in the direction normal to direction that is twice as large as that of the Si. In some embodiments layer of $SrSi_{1-x}Ge_x$ 420 can be between one half to one atomic layer thick and can be deposited via MBE, evaporation or other deposition process.

As illustrated in FIG. 4C (step 515 of FIG. 5) a layer of amorphous $SrTiO_3$ 425 can be deposited on layer of $SrSi_{1-x}Ge_x$ 420. In some embodiments the growth of layer of amorphous $SrTiO_3$ 425 is performed in a transient environment, as described in more detail in FIGS. 3A-3C and the accompanying description. In various embodiments layer of amorphous $SrTiO_3$ 425 is deposited with a thickness of 2-10 monolayers which can be sufficient to protect silicon surface 415 from oxidation when using the process parameters described in FIGS. 3A-3C.

As illustrated in FIG. 4D (step 220 of FIG. 5), as the wafer temperature increases (see t2 in FIG. 3B), layer of amorphous $SrTiO_3$ 425 (see FIG. 4C) crystalizes forming an epitaxial crystalline $SrTiO_3$ layer 430. As further shown in FIG. 4D, the crystalline $SrTiO_3$ layer 430 continues to increase in thickness, however now that the $SrTiO_3$ layer is crystalline, the growth of the layer is also crystalline. As crystalline $SrTiO_3$ layer 430 approaches a thickness of approximately 3 nanometers, the oxygen pressure and the temperature can be stabilized (see t3 in FIGS. 3A, 3B) and the crystalline $SrTiO_3$ layer continues to grow at a steady growth rate. As crystalline $SrTiO_3$ layer 430 continues to increase in thickness it creates improved protection for silicon surface 415 from oxidation so the process parameters can be optimized for growth of the $SrTiO_3$ layer with less concern for preventing oxidation of the silicon surface.

As would be appreciated by one of skill in the art with the benefit of this disclosure the thickness of crystalline $SrTiO_3$ layer 430 that is adequate to prevent oxidation of silicon wafer 405 can vary depending upon a temperature of silicon wafer 405, the concentration of the oxygen in the growth environment and other factors. Thus, in some embodiments a $SrTiO_3$ layer 430 thickness that is adequate to stabilize itself and to prevent oxidation of silicon wafer 405 can be between 1 and 6 nanometers and in various embodiments between 2 and 4 nanometers and in one embodiment between 2.5 and 3.5 nanometers.

As illustrated in FIG. 4E (step 525 of FIG. 5) silicon wafer 405 is exposed to molecular oxygen at a temperature above 600° C. The molecular oxygen permeates crystalline $SrTiO_3$ layer 430 and oxidizes $Si_{1-x}Ge_x$ layer 410 (see FIG. 4D) and layer of SrSi 420 forming transition layer 435. More specifically, the molecular oxygen converts $Si_{1-x}Ge_x$ to amorphous $Si_{1-x}Ge_xO_2$. The composition of the amorphous $Si_{1-x}Ge_xO_2$ can vary due to inter-diffusion of the $Si_{1-x}Ge_xO_2$ with silicon wafer 405. The resulting amorphous $Si_{1-x}Ge_xO_2$ regions are transparent at certain wavelengths that may be suitable for use in lasers, including 1550 nanometers. The molecular oxygen also converts layer of SrSi 420 to SrSiO and/or Sr(Si,Ge)O. Thus, transition layer 435 can be composed of varying concentrations of amorphous $Si_{1-x}Ge_xO_2$, SrSiO and/or Sr(Si,Ge)O. Further, during this step, the exposure to annealing temperatures can improve the crystallinity of crystalline $SrTiO_3$ layer 430.

As illustrated in FIG. 4F (step 430 of FIG. 5) after oxidation/annealing step 525, crystalline $SrTiO_3$ layer 430 growth process is restarted and the crystalline $SrTiO_3$ layer is grown to the desired thickness. In some embodiments oxidation/annealing step 525 can be repeated as needed to improve the crystallinity of crystalline $SrTiO_3$ layer 430.

It will be appreciated that process 500 is illustrative and that variations and modifications are possible. Steps described as sequential may be executed in parallel, order of steps may be varied, and steps may be modified, combined, added or omitted.

Figure 6A:
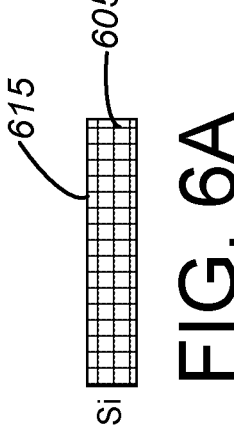
FIGS. 6A-6F illustrates simplified cross-sectional views of steps for forming a crystalline $SrTiO_3$ layer on a silicon wafer that includes a strontium silicon layer, according to embodiments of the disclosure.
Figure 6B:
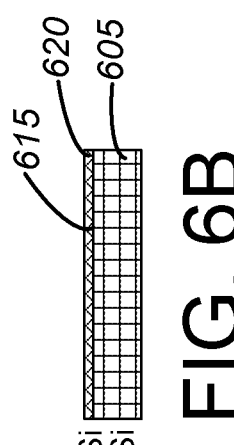
Figure 6C:
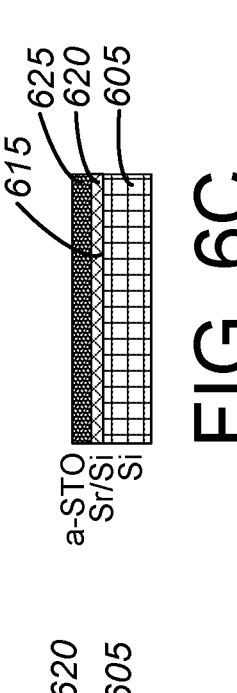
Figure 6D:
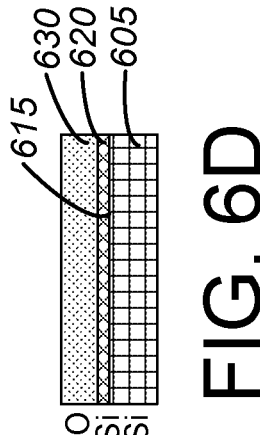
Figure 6E:
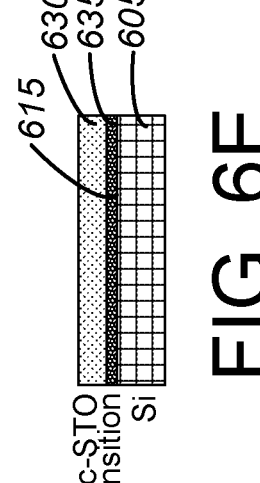
Figure 6F:
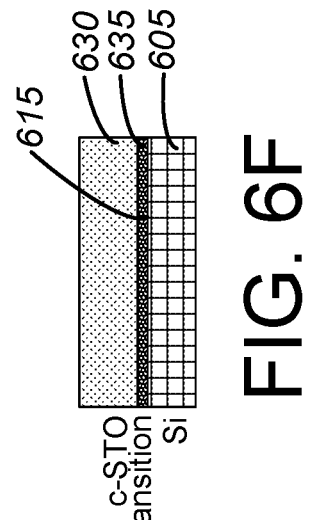
Figure 7:
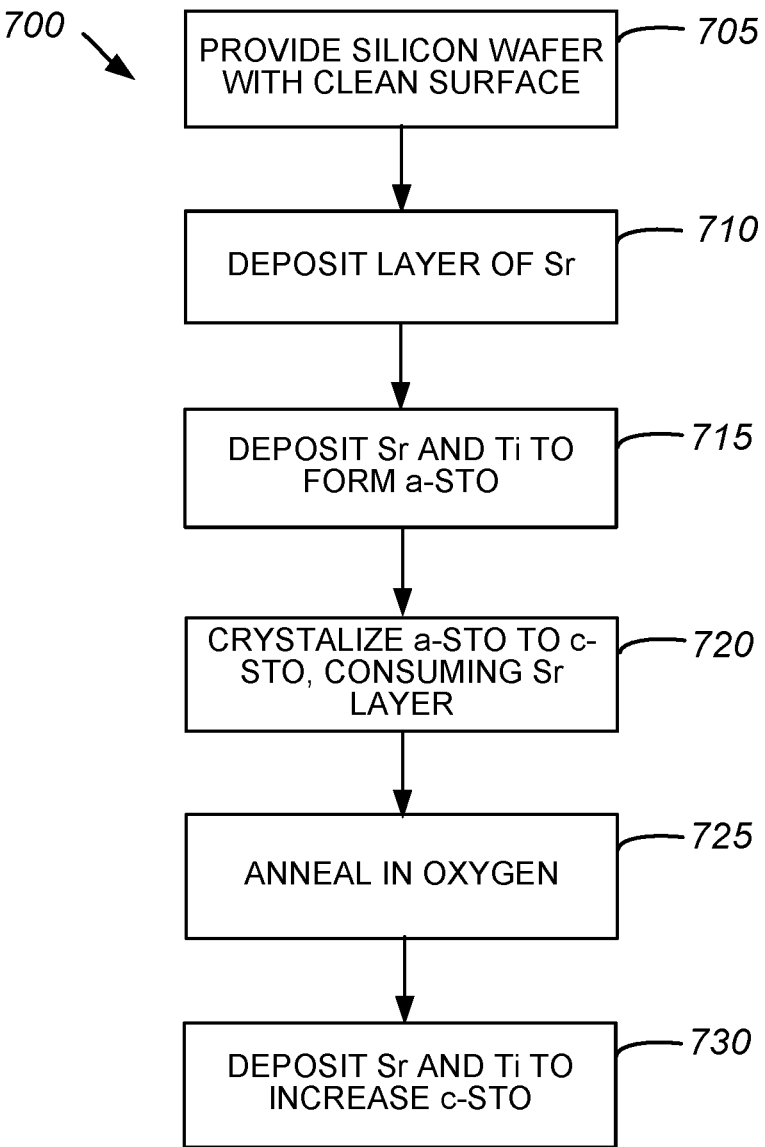
FIG. 7 is a method for forming the crystalline $SrTiO_3$ layer on a silicon wafer according to the steps illustrated in FIGS. 6A-6F.

FIGS. 6A-6F illustrate simplified cross-sectional views of steps, according to a method 700 described in FIG. 7, for forming a $SrTiO_3$ layer on a silicon wafer, according embodiments of the disclosure. As shown in FIG. 7, method 700 uses a similar process as method 200 (see FIGS. 1-3), however in method 700, first step 705 starts with a silicon wafer 605 having no other layers, instead of the silicon wafer with Ge that was used in method 200. Further, method 700 includes step 710 to oxidize a surface of the silicon, as described in more detail below.

As illustrated in FIG. 6A (step 705 of FIG. 7) a single crystal silicon wafer 605 is provided. In some embodiments one or more processes can be performed that remove native oxides from a top surface 615 silicon wafer 605.

As illustrated in FIG. 6B (step 710 of FIG. 7) a layer of Sr is deposited on top surface 615 of silicon wafer 605 to form a layer of $SrSi_{1-x}Ge_x$ 620. In some embodiments layer of $SrSi_{1-x}Ge_x$ has a (2×1) structure in which the size of the atomic unit cell is twice as large as that of the underlying Si (2×) in one direction, but is the same size as that of the of underlying Si (1×) in the direction normal to direction that is twice as large as that of the Si. In some embodiments the layer of Sr can be between one half an atomic layer to one atomic layer thick and can be deposited via MBE or other deposition process.

As illustrated in FIG. 6C (step 715 of FIG. 7) a layer of amorphous $SrTiO_3$ 625 can be deposited on layer of $SrSi_{1-x}Ge_x$ 620. In some embodiments the growth of the layer of $SrTiO_3$ 625 is performed in a transient environment, as described in more detail in FIGS. 3A-3C. In some embodiments layer of $SrTiO_3$ 625 is deposited to a thickness of 2-10 monolayers, which can sufficient to protect silicon surface 615 from oxidation when using the process parameters described in FIGS. 3A-3C.

As illustrated in FIG. 6D (step 720 of FIG. 7), as a temperature of silicon wafer 605 increases (see t2 in FIG. 3B), layer of amorphous $SrTiO_3$ 625 (see FIG. 6C) crystalizes forming an epitaxial crystalline $SrTiO_3$ layer 630. As further shown in FIG. 6D, crystalline $SrTiO_3$ layer 630 continues to increase in thickness, however now that the $SrTiO_3$ layer is crystalline, the growth of the layer is also crystalline. As crystalline $SrTiO_3$ layer 630 approaches a thickness of approximately 3 nanometers, the oxygen pressure and the temperature can be stabilized (see t3 in FIGS. 3A, 3B) and the crystalline $SrTiO_3$ layer continues to grow at a steady growth rate. As crystalline $SrTiO_3$ layer 630 continues to increase in thickness it creates improved protection for silicon surface 615 from oxidation so the process parameters can be optimized for growth of the SrTiO$_3$ layer with less concern for preventing oxidation of the silicon surface.

As would be appreciated by one of skill in the art with the benefit of this disclosure the thickness of crystalline SrTiO$_3$ layer 630 that is adequate to prevent oxidation of silicon wafer 605 can vary depending upon a temperature of silicon wafer 605, the concentration of the oxygen in the growth environment and other factors. Thus, in some embodiments a SrTiO$_3$ layer 630 thickness that is adequate to prevent oxidation of silicon wafer 605 can be between 1 and 6 nanometers and in various embodiments between 2 and 4 nanometers and in one embodiment between 2.5 and 3.5 nanometers.

As illustrated in FIG. 6E (step 725 of FIG. 7) silicon wafer 605 is exposed to molecular oxygen, atomic oxygen, or ozone at a temperature above 600° C. The oxygen permeates crystalline SrTiO$_3$ layer 630 and oxidizes layer of SrSi 620 (see FIG. 6D) and top surface 615 of silicon wafer 605, forming transition layer 635. More specifically, the molecular oxygen converts Si to amorphous SiO$_2$ which is transparent at certain wavelengths that may be suitable for use in lasers, including 1550 nanometers. The molecular oxygen also converts layer of SrSi 620 to SrSiO. Thus, transition layer 635 can be composed of varying concentrations of amorphous SiO$_2$ and SrSiO. Further, during this step, the exposure to annealing temperatures can improve the crystallinity of crystalline SrTiO$_3$ layer 630.

As illustrated in FIG. 6F (step 730 of FIG. 7) after oxidation/annealing step 725, crystalline SrTiO$_3$ layer 630 growth process is restarted and crystalline SrTiO$_3$ layer 630 is grown to the desired thickness. In some embodiments oxidation/annealing step 725 can be repeated as needed to improve the crystallinity of crystalline SrTiO$_3$ layer 630.

It will be appreciated that process 700 is illustrative and that variations and modifications are possible. Steps described as sequential may be executed in parallel, order of steps may be varied, and steps may be modified, combined, added or omitted.

In the foregoing specification, embodiments of the disclosure have been described with reference to numerous specific details that can vary from implementation to implementation. The specification and drawings are, accordingly, to be regarded in an illustrative rather than a restrictive sense. The sole and exclusive indicator of the scope of the disclosure, and what is intended by the applicants to be the scope of the disclosure, is the literal and equivalent scope of the set of claims that issue from this application, in the specific form in which such claims issue, including any subsequent correction. The specific details of particular embodiments can be combined in any suitable manner without departing from the spirit and scope of embodiments of the disclosure.

Additionally, spatially relative terms, such as "bottom or "top" and the like can be used to describe an element and/or feature's relationship to another element(s) and/or feature(s) as, for example, illustrated in the figures. It will be understood that the spatially relative terms are intended to encompass different orientations of the device in use and/or operation in addition to the orientation depicted in the figures. For example, if the device in the figures is turned over, elements described as a "bottom" surface can then be oriented "above" other elements or features. The device can be otherwise oriented (e.g., rotated 90 degrees or at other orientations) and the spatially relative descriptors used herein interpreted accordingly.

What is claimed is:

1. A method for processing a substrate, the method comprising:

positioning the substrate in a deposition chamber, wherein the substrate comprises a wafer of single crystal silicon having a top surface;

forming one or more intermediate layers on the top surface of the wafer of single crystal silicon;

forming an amorphous strontium titanium oxide layer on the one or more intermediate layers using molecular-beam epitaxy (MBE) in an environment in which oxygen pressure is reduced while temperature is increased;

converting the amorphous strontium titanium oxide layer to a crystalline strontium titanium oxide layer;

after converting the amorphous strontium titanium oxide layer to a crystalline strontium titanium oxide layer, oxidizing the one or more intermediate layers to form a transition layer disposed between the substrate and the crystalline strontium titanium oxide layer; and increasing a thickness of the crystalline strontium titanium oxide layer.

2. The method of claim 1 wherein the one or more intermediate layers comprise germanium.

3. The method of claim 2 wherein the one or more intermediate layers comprise atomic deposits of germanium randomly dispersed on the top surface of the wafer of single crystal silicon, and wherein the transition layer comprises germanium oxide.

4. The method of claim 1 wherein the one or more intermediate layers comprise silicon germanium and wherein the transition layer comprises silicon germanium oxide.

5. The method of claim 4 wherein the one or more intermediate layers comprises a graded silicon germanium layer that transitions from a composition greater in silicon than germanium at the wafer of single crystal silicon to a composition greater in germanium than silicon at a top surface of the one or more intermediate layers.

6. The method of claim 1 wherein the one or more intermediate layers comprise a combination of strontium and silicon.

7. The method of claim 6 wherein the one or more intermediate layers comprise a layer of strontium silicide (SrSi) deposited on the top surface of the wafer of single crystal silicon and wherein the transition layer comprises strontium silicate (SrSiO).

8. The method of claim 1 wherein the transition layer is amorphous.

9. A method comprising:

providing a silicon-based substrate;

depositing a layer containing strontium on the silicon-based substrate;

providing an oxygen environment;

performing molecular-beam epitaxy (MBE) in the oxygen environment to form an amorphous strontium titanium oxide layer on the layer containing strontium, wherein performing MBE in the oxygen environment comprises:

reducing oxygen pressure of the oxygen environment; and increasing temperature of the oxygen environment;

converting the amorphous strontium titanium oxide layer to a crystalline strontium titanium oxide layer;

after converting the amorphous strontium titanium oxide layer to the crystalline strontium titanium oxide layer, oxidizing the layer containing strontium to form an amorphous strontium oxide layer disposed between the silicon-based substrate and the crystalline strontium titanium oxide layer; and increasing a thickness of the crystalline strontium titanium oxide layer.

10. The method of claim 9 wherein atomic deposits of germanium are randomly dispersed on the silicon-based substrate before the depositing the strontium containing layer.

11. The method of claim 9 further comprising depositing a silicon germanium layer on the silicon-based substrate before the depositing the strontium containing layer.

12. The method of claim 11 wherein the silicon germanium layer is a graded silicon germanium layer that transitions from a composition greater in silicon than germanium at the silicon substrate to a composition greater in germanium than silicon at a top surface of the graded silicon germanium layer.

13. The method of claim 9 wherein the silicon-based substrate is characterized by a clean top surface.

14. The method of claim 9 wherein a layer of strontium silicide is formed when depositing the layer containing strontium on the silicon-based substrate.

15. A method for processing a substrate, the method comprising:

positioning the substrate in a deposition chamber, wherein the substrate comprises a top layer of silicon having a top surface;

forming one or more intermediate layers on the top surface of the top layer of silicon;

forming an amorphous layer of strontium titanium oxide on the one or more intermediate layers using molecular-beam epitaxy (MBE) in an environment in which oxygen pressure is reduced while temperature is increased;

converting the amorphous layer of strontium titanium oxide to a crystalline layer of strontium titanium oxide; and after converting the amorphous layer of strontium titanium oxide to the crystalline layer of strontium titanium oxide, oxidizing the one or more intermediate layers to form a transition layer disposed between the substrate and the crystalline layer of strontium titanium oxide.

16. The method of claim 15 wherein converting the amorphous layer of strontium titanium oxide to the crystalline layer of strontium titanium oxide is performed by heating the substrate.

17. The method of claim 16 wherein the substrate is heated to a temperature above 500° C.

18. The method of claim 15 wherein the one or more intermediate layers comprise atomic deposits of germanium randomly dispersed on the top surface of the top layer of silicon and the transition layer comprises amorphous germanium oxide.

19. The method of claim 15 wherein the transition layer comprises a graded silicon germanium layer that transitions from a composition greater in silicon than germanium at the top layer of silicon to a composition greater in germanium than silicon at a top surface of the transition layer.

20. The method of claim 15 wherein the top surface of the top layer of silicon is a clean top surface.

* * * * *